(12) United States Patent
Lattimore et al.

(10) Patent No.: US 6,737,888 B1
(45) Date of Patent: May 18, 2004

(54) METHOD FOR SKIPPING A LATCH IN TIMING-SENSITIVE DYNAMIC CIRCUITS OF A MULTI-CLOCKED SYSTEM WITH UNSPECIFIC UNDERLAP REQUIREMENT

(75) Inventors: George McNeil Lattimore, Austin, TX (US); Donald George Mikan, Jr., Austin, TX (US); Jose Angel Paredes, Austin, TX (US); Gus Wai-Yan Yeung, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/435,864

(22) Filed: Nov. 8, 1999

(51) Int. Cl.[7] .............................................. H03K 19/01
(52) U.S. Cl. ........................................ 326/93; 326/121
(58) Field of Search .............................. 326/93, 95–98, 326/112, 119, 121

(56) References Cited

U.S. PATENT DOCUMENTS

| | | | | |
|---|---|---|---|---|
| 5,378,942 A | * | 1/1995 | Wu et al. ...................... | 326/97 |
| 5,453,708 A | * | 9/1995 | Gupta et al. .................. | 326/98 |
| 5,825,208 A | * | 10/1998 | Levy et al. .................... | 326/98 |
| 5,880,608 A | * | 3/1999 | Mehta et al. .................. | 326/98 |
| 6,040,716 A | * | 3/2000 | Bosshart ....................... | 326/98 |

* cited by examiner

*Primary Examiner*—Don Le
(74) *Attorney, Agent, or Firm*—Duke W. Yee; Casimer K. Salys; Stephen R. Tkacs

(57) ABSTRACT

A first clock stage in a circuit utilizes a second stage clock for triggering the falling edge of a first clock stage output. The output will not reset until both the first clock is low and the second clock are high due to the addition of the second clock signal. This is accomplished by adding a transistor and inverter to the first stage. The drain of a P-type FET is connected to source of the P-FET being controlled by the first clock through its gate. The additional P-FET is controlled by an inverted second clock signal. The clock signal is inverted by an inverter connected to the gate of the additional P-FET. Stability is provided to the first stage by creating a full keeper, which holds the output from the logic device in the first stage. A pair of transistors are connected by their drains to the output of the logic device. The transistors are controlled by an inverter, which is connected to the pairs' bases, wherein the inverter receives the output from the logic device. The transistor pair comprises one N-FET and P-FET.

8 Claims, 3 Drawing Sheets

METHOD FOR SKIPPING A LATCH IN TIMING-SENSITIVE DYNAMIC CIRCUITS OF A MULTI-CLOCKED SYSTEM WITH UNSPECIFIC UNDERLAP REQUIREMENT

BACKGROUND OF THE INVENTION

1. Technical Field

The present invention relates generally to staged circuits and, more specifically, to staged circuits, which use multi-clocks for timing.

2. Description of Related Art

It has been well known in the art to process data signal inputs in a first stage of a multi-stage circuit and then use the output from the first stage as an input for a subsequent stage. While dynamic circuit applications are known wherein each stage is clocked using a single clock, multi-clock systems are well known. In a typical multi-clock system, a first stage receives first inputs for processing, which are clocked using a first clock. The output of the first stage is fed to the input of a second stage, which is processed using a second clock.

Generally, for the second or later stages of such a design to work, the reset of the previous stage driven by its clock must be slow enough, so that the previous stage outputs are held as the inputs on a subsequent stage long enough for the circuit to properly evaluate.

FIG. 1 is a schematic of a multi-stage circuit having first and second stages being controlled by first and second clocks. In the depicted figure, two stage circuit 100 includes four P-FETs (P-channel Field Effect Transistors), transistors P102, P104, P106, and P108, as well as three N-FETs (N-channel Field Effect transistors), N102, N104, and N106. Each stage contains a logic device, one of devices L102 and L104, and a pair of inverters, I102 and I104 or I106 and I108. Stage 1 comprises logic device L102 being connected to drains of transistors P102 and N102, respectively, where clock C1 is fed to the transistors' gates. The drain of transistor P102 is connected to an output port of logic device L102. The drain of transistor P102 is further connected to the inputs of inverters I102 and I104 and the drain of transistor P104. The output of inverter I102 feeds to the gate of transistor P104 whose drain is tied to the inputs of inverters I102 and I104.

The output of inverter I104 provides input signal O1 for the stage 2, including logic device L104. The remainder of stage 2 is similar to that of stage 1, comprising logic device L104 being connected to drains of transistors P106 and N104, respectively, where clock C2 is fed to the transistors' gates. The drain of transistor P106 being connected to an output port of logic device L104 and is further connected to the inputs of inverters I106 and I108. The output of inverter I106 feeds the gates of transistors P108 and N106 whose drains are tied to the inputs of inverters I106 and I108 and to the output port of logic device 104. The evaluation results from logic device 104 are inverted by inverter I108, and then output from stage 2.

Dual clock circuit 100 depicted in FIG. 1 is for use in applications in which the two clocks (C1 and C2) are not underlapped. The design shown in FIG. 1 assumes that the clocks are not underlapped. In other words, C1 rises at the same time C2 falls and more importantly for the second stage, C2 rises and the same time that C1 falls. In the case where this relationship cannot be guaranteed (but the clocks are guaranteed to be underlapped), extra logic must be added so that the outputs of the C1 stage are stable for the inputs of the C2 stage. This extra logic poses performance and stability problems for the system.

It would be advantageous to deal with the underlap condition without adding extra logic to the system.

SUMMARY OF THE INVENTION

The present invention relates to a means for solving the undeterminable clock underlap problem associated with multi-stage, multi-clock circuits. The first stage of the multi-stage circuit utilizes a first clock for outputting a signal to the second stage. However, rather than relying on the first clock for triggering both the rising edge and the falling edge of the output, the first stage utilizes a second clock for triggering the falling edge of the output. The second clock also controls the second stage output. In a preferred embodiment of the present invention, this occurs because the first clock stage will not reset until both the first clock is low and second clock are high due to the addition of the second clock signal. The duration of the control clock signal used for controlling the first stage output is increased from an interval defined by the duration of the first clock to an interval defined by the duration of the first clock combined with the inverted second clock signal. The clock falling edge, which triggers the falling edge of the output now becomes the inverted rising edge of the second clock. In accordance with a preferred embodiment, this is accomplished by adding a transistor and inverter to the first stage. The drain of a P-type FET is connected to the source of the P-FET being controlled by the first clock through its gate. The additional P-FET is controlled by an inverted second clock signal, the clock signal being inverted by an inverter connected to the gate of the additional P-FET.

Stability is provided to the first stage by creating a full keeper, which holds the evaluation results from the logic device in the first stage. A pair of transistors are connected by their drains to the evaluation results output of the logic device. The transistors are controlled by an inverter, which is connected to the pair's bases, wherein the inverter receives the evaluation results. The transistor pair comprises one N-FET and P-FET.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 2:
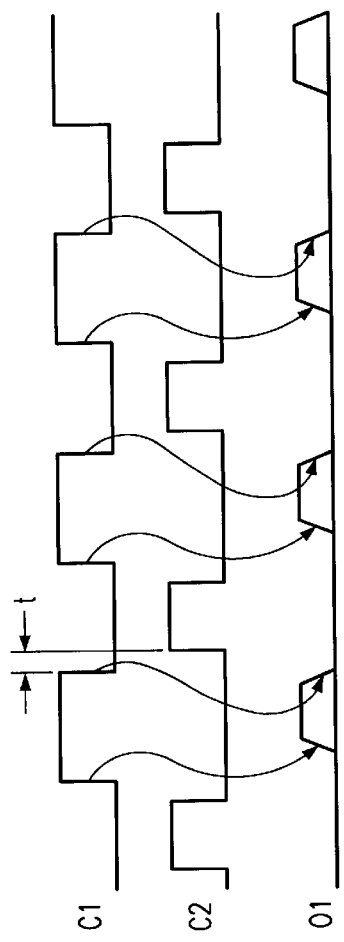
FIG. 2 is a timing diagram showing waveforms depicting the problem associated with the underlap condition.

FIG. 2 is a timing diagram showing waveforms depicting the problem associated with the underlap condition. Simply stated, the output from the first stage must be seen during the clock controlling stage 2. If the clock controlling the first stage goes away, causing the output of the first stage to restore, the clock controlling stage 2 arrives time t late to see the output. Referring to FIG. 2, the rising edge of clock C1 triggers the rising edge of output signal O1 from a logic device L102, and the falling edge of clock C1 triggers the falling edge of output O1. The time period t between the falling edge of clock C1 and the rising edge of clock C2 represents the underlap condition. Because the rising edge of clock C2 arrives after the falling edge of clock C1, output O1 cannot be seen by the stage 2 logic. However, if a circuit designer knows, or can calculate, the underlap period t, the designer can add more stages of logic. The additional stages increase the extent of the propagation delay of the falling edge of output O1 past the duration of time period t (plus some evaluation time for the logic of the C2 phase). Usually, though, adding more stages of logic affects the overall performance of the circuit because the rising edge of O1 is also delayed.

Figure 1:
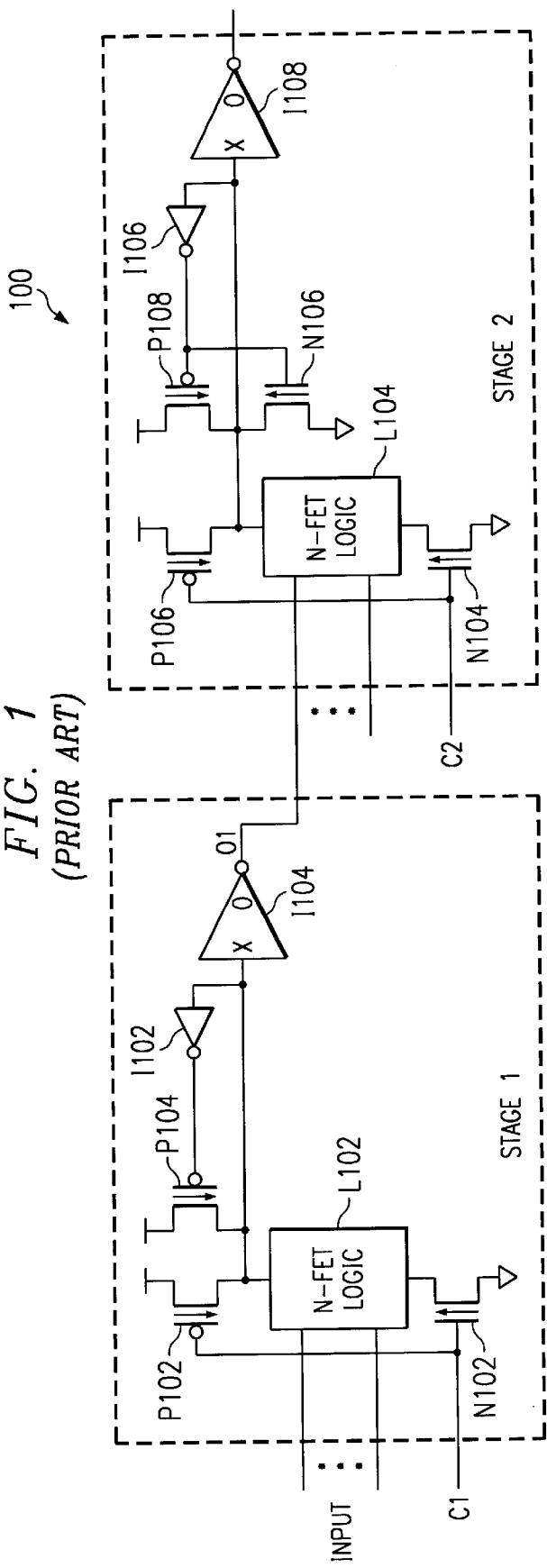
FIG. 1 is a schematic of a multi-stage circuit having first and second stages being controlled by first and second clocks.

In order for a design to work, such as dual stage circuit 100 shown in FIG. 1, the reset of the clock C1 stage must be slow enough so that the inputs are held on clock C2 stage long enough for the circuit to properly evaluate. Referring to FIG. 1, transistors P108 and N106, along with the inverter I106 create a "full keeper", which holds the evaluation results of the second stage. Such a design is not extremely difficult to accomplish if clock C1 falls at the same time clock C2 rises, since there is almost always enough propagation delay between the two stages to guarantee that the first stage resets slow enough for the second stage to see the outputs and evaluate in enough time for the full keeper to latch the results. The reset of the first stage can sometimes even be slowed down by adding more static circuits (inverters, etc.) between the first and second stage of the design. However, problems occur in the prior art where the underlap period t is not known or cannot be calculated.

Figure 3:
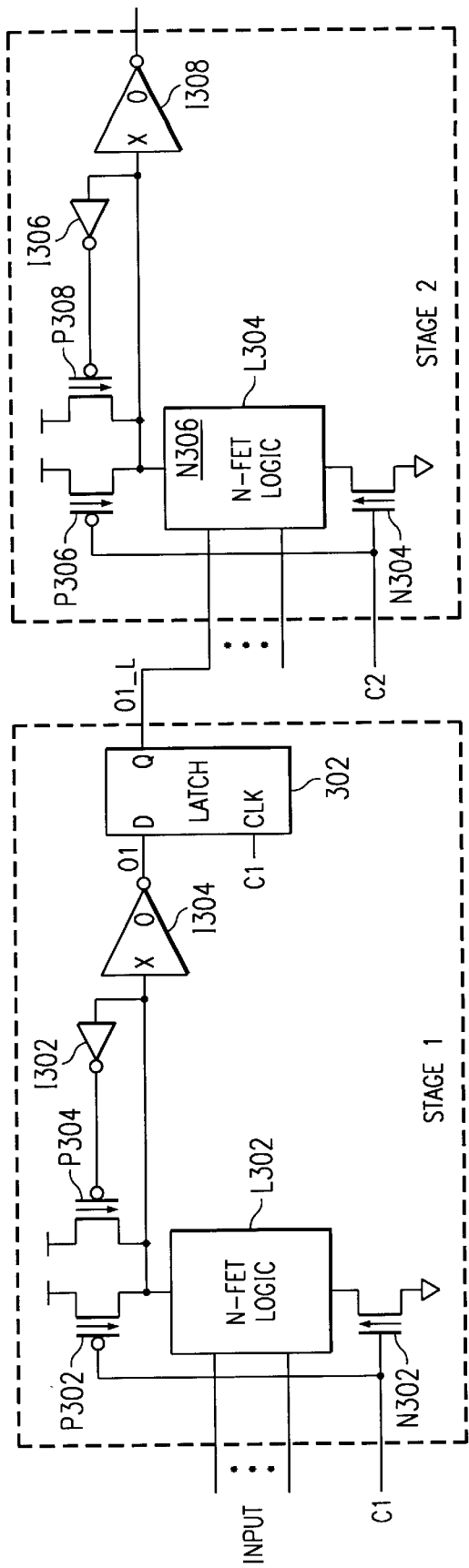
FIG. 3 is a circuit diagram depicting a two stage circuit, which shows a solution to this undetermined underlapped problem.

FIG. 3 is a circuit diagram depicting a two stage circuit, which shows a solution to this undetermined underlapped problem. Stage 1 in FIG. 3 is identical to stage 1 in FIG. 1 with the exception of latch 302. In the depicted figure, two stage circuit 300 includes four P-FETs, transistors P302, P304, P306, and P308, as well as two N-FETs, transistors, N302 and N304. Each stage contains a logic device, devices L302 and L304, and a pair of inverters, I302 and I304 or I306 and I308. Stage 1 comprises logic device L302 being connected to drains of transistors P302 and N302, respectively, whereby clock C1 is fed to the transistors' gates. The drain of transistor P302 is further connected to the inputs of inverters I302 and I304. The output of inverter I302 feeds the gate of transistor P304 whose drain is tied to the inputs of inverters I302 and I304. Output O1 from inverter I304 is tied to the data input of D latch 302. Clock C1 is used to clock the latch and Q-output signal O1_L of latch 302 provides input for stage 2, including logic device L304.

Latch 302 is situated between the two stages and guarantees that the outputs of the clock C1 stage, are stable for the clock C2 stage, to evaluate, even though the dynamic portion of stage 1 might have been held in reset long before the rising edge of clock C2.

The remainder of stage 2 is again similar to stage 1, comprising logic device L304 being connected to drains of transistors P306 and N304, respectively, where clock C2 is fed to the transistor's gates, in addition to latch 302 in stage 1. The drain of transistor P306 is further connected to the inputs of inverters I306 and I308. The output of inverter I306 feeds to the gate of transistor P304 whose drain is tied to the inputs of inverters I306 and I308. The processed signal outputs inverter I308.

Figure 4:
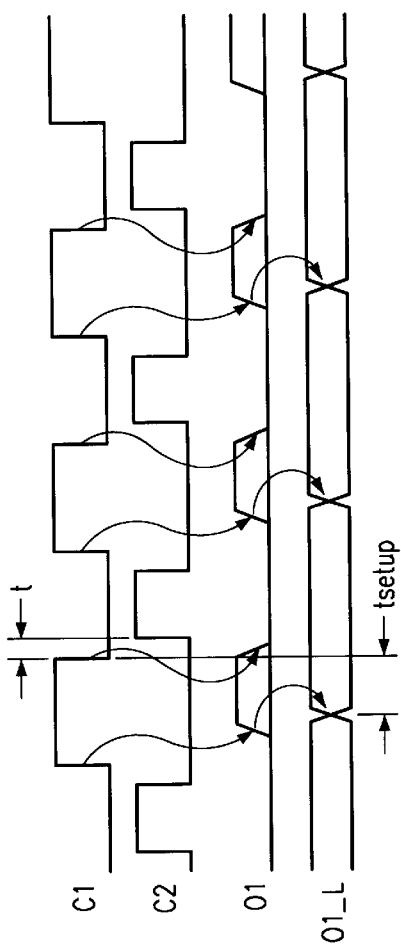
FIG. 4 is a timing diagram associated with circuit 300 depicted in FIG. 3.

FIG. 4 is a timing diagram associated with circuit 300 depicted in FIG. 3. Clocks C1 and C2 produce output signal O1 in the manner described above with respect to FIG. 2, however, rather than using output O1 as in input for stage 2, signal O1 is fed into the data port of latch 302. Latch 302 is clocked with clock C2 producing latched output O1_L.

If time t is unknown i.e. the underlap between C1 and C2 is unspecified, holding O1 past the falling edge of C1 is much more difficult. Employing intermediate latch 302, as shown in FIG. 3, demonstrates one method for solving the problem. Latch 302 produces output O1_L used to feed the input of stage 2, rather than output O1.

Although the new design solves the problem viewing O1 during clock C2 due to the unknown underlap period, the overall performance of the original design is impacted because of the extra propagation delay associated with latch 302 and because the outputs of the first stage now must adhere to setup and hold requirements of latch 302. Output O1 must rise at least a period equal to tsetup time before clock C1 rises. Therefore, special care must be taken when implementing dynamic circuits in dual clocked system 300 where the two clocks might be underlapped for an indefinite amount of time, and the outputs of the first stage of dynamic circuits are needed as inputs to the second stage of dynamic circuits. The use of latch 302 situated between the two stages is not always feasible, since the extra latch will have an impact on performance and size.

Figure 5:
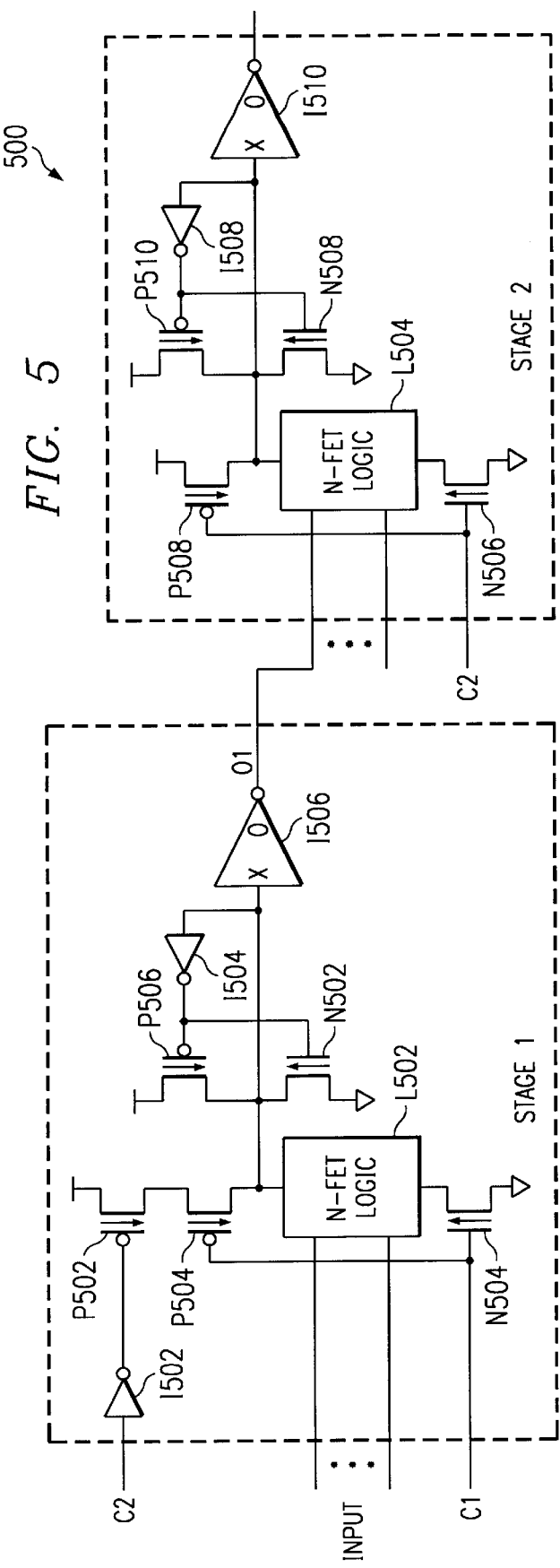
FIG. 5 is a schematic depicting an "underlap friendly" multi-stage circuit having two stages clocked by first and second clocks in accordance with a preferred embodiment of the present invention.

FIG. 5 is a schematic depicting an "underlap friendly" multi-stage circuit having two stages clocked by first and second clocks in accordance with a preferred embodiment of the present invention. Intermediate latch 302 depicted in FIG. 3, is removed from two stage circuit 500 and transistor P502 and the inverter I502 are added. The change to stage 1 has no impact on evaluation performance. The addition of transistor P502 and inverter I502 ensure that clock C1 stage will not reset until both clock C1 is low and clock C2 is high, as opposed to resetting only when clock C1 falls.

Stage 1 now includes three P-FETs, P502, P504, and P506 and a pair of N-FETs, N502 and N504. Also included are inverters I502, I504 and I506. Stage 1 comprises logic device L502 being connected to drains of transistors P504 and N504, respectively, where clock C1 is fed to the transistors' gates. The source of transistor P504 is fed by the drain of transistor P502, which is controlled by inverted clock signal C2. Clock C2 is inverted by inverter I502, whose output is connected directly to the gate of transistor P502. The drain of transistor P504 is further connected to the inputs of inverters I504 and I506 and the drains of transistors P506 and N502. The output of inverter I504 feeds the gate of transistor P506 whose source is tied to the input of inverter I504. Devices N502 and P506, along with inverter I504 create a full keeper, which holds the evaluation results of stage 1 prior to inversion by I506. Output O1 from inverter I504 is then fed to stage 2.

Transistors P506 and N502 and inverter I502 ensure that the outputs of the clock C1 stage are stable even after clock C1 has fallen. Otherwise, stage 1 of circuit 500 is identical to that of stage 1 of circuit 300 depicted in FIG. 3. By adding four simple devices to stage 1, the C1 stage circuit can be treated by the stage 2 as if no underlap condition existed. Furthermore, the modifications to the first stage are made without regard to setup and hold requirements of an intermediate latch or the performance impact associated with the extra propagation delay of the latch because the duration of output O1 is extended rather than generating latch output O1_L. Stage 2 may be of any design, including that shown in FIG. 1. In the present figure, stage 2 is identical to that shown in FIG. 1.

Figure 6:
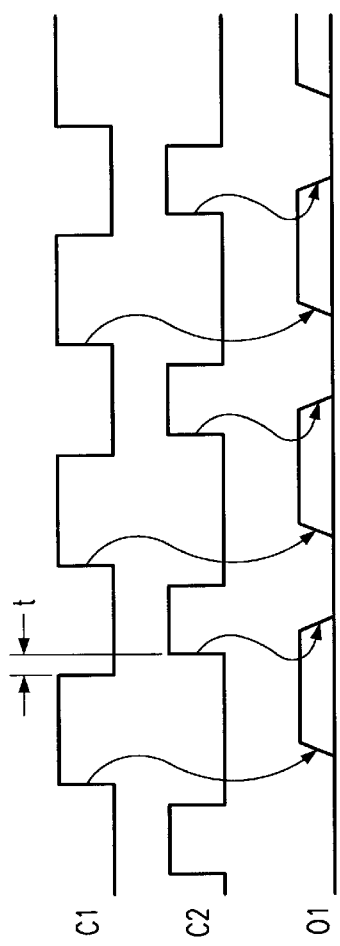
FIG. 6 is a timing diagram depicting the timing waveforms in accordance with a preferred embodiment of the present invention.

FIG. 6 is a timing diagram depicting the timing waveforms in accordance with a preferred embodiment of the present invention. The rising edge of clock C2 arrives after the falling edge of clock C1 indicating an underlap condition. The undeterminable time period t between the falling edge of clock C1, and the rising edge of clock C2 represents the extent of the underlap condition. Here, as in the waveforms in FIG. 2, the rising edge of clock C1 triggers the rising edge of output signal O1 from logic device L502 (shown in FIG. 5), however, the falling edge of output O1 is triggered by the falling edge of clock C2 rather than clock C1. The duration of output o1 is therefore increased sufficiently to cover time period t without regard to its duration. This occurs because clock C1 stage will not reset until both the clock C1 is low and the inverted clock C2 are low due to the addition of clock signal C2 piped through inverter I502 and transistor P502 as shown in FIG. 5.

Therefore, whether or not clock C1 goes away, output O1 does not restore. The rising edge of clock C2 triggers the falling edge of output O1. Hence, the unknown time period t has no affect on the stage 2, regardless of its duration, the duration of output O1 always extends past the clock C2 arrival.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention and the practical application, and to enable others of ordinary skill in the art to understand the invention for various embodiments with various modifications as are suited to the particular use contemplated. One of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims. Therefore, it is the object of the appended claims to cover all such variations and modifications as come within the true spirit and scope of the invention.

What is claimed is:

1. A method for dealing with an unspecific underlap requirement in timing-sensitive dynamic circuits of a multi-clocked system comprising:

receiving a first clock signal in a first stage;

controlling an output from the first stage using the first clock signal; and receiving a second clock signal in the first stage;

controlling the output from the first stage using the second clock signal, wherein controlling evaluation results from the first stage using the first clock signal further comprises:

inverting the second clock signal; and triggering a falling edge of the output using a falling edge of the inverted second clock signal.

2. A method for dealing with an unspecified underlap requirement in timing-sensitive dynamic circuits of a multi-clocked system comprising:

receiving a first clock signal in a first stage;

receiving a second clock signal in the first stage;

inverting the second clock signal;

triggering a rising edge of an output using a rising edge of the first clock signal;

triggering a falling edge of the output using a falling edge of the inverted second clock signal; and outputting the output to a second stage.

3. A multi-clocked system with timing-sensitive dynamic circuits for dealing with an unspecific underlap requirement comprising:

a first stage comprising:
   a logic device, wherein the logic device has at least one output port;
   a first transistor connected to a first clock source at a first transistor gate,
   wherein a first transistor drain of the first transistor is connected to an output port of the logic device;
   a second transistor connected to a second clock source at a second transistor gate,
   wherein a second transistor drain of the second transistor is connected to the first transistor at a first transistor source; and
a second stage, wherein the second stage is connected to the first stage for receiving an output, wherein the second clock source is a first inverter for inverting the second clock signal prior to being received by the second transistor gate.

4. The multi-clocked system recited in claim 3, wherein the first stage further comprises:

third and fourth transistors connected to the output port of the logic device at a third and fourth transistor drain.

5. The multi-clocked system recited in claim 4, wherein the first stage further comprises:

a second inverter connected to the output port of the logic device and to each of a third and fourth transistor gate of the third and fourth transistors, respectively, wherein the second inverter delivers an inverted signal to each of the third and fourth transistor gates.

6. The multi-clocked system recited in claim 5, wherein the first stage further comprises:

a third inverter connected to the output port of the logic device.

7. The multi-clocked system recited in claim 4, wherein the third and fourth transistors are one each of a P-type field effect transistor and a N-type field effect transistor.

8. The multi-clocked system recited in claim 5, wherein the third and fourth transistors and the second inverter create a full keeper, wherein the full keeper holds the output.

* * * * *